United States Patent
Uo et al.

(10) Patent No.: US 8,207,879 B2
(45) Date of Patent: Jun. 26, 2012

(54) ANALOG-TO-DIGITAL CONVERTER, ANALOG-TO-DIGITAL CONVERSION METHOD, AND OPTICALLY COUPLED INSULATING DEVICE

(75) Inventors: Toyoaki Uo, Kanagawa-ken (JP); Hisami Saitou, Kanagawa-ken (JP); Atsushi Iwata, Hiroshima-ken (JP); Yoshitaka Murasaka, Hiroshima-ken (JP); Toshifumi Imamura, Hiroshima-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 98 days.

(21) Appl. No.: 12/796,157

(22) Filed: Jun. 8, 2010

(65) Prior Publication Data
US 2010/0309032 A1    Dec. 9, 2010

(30) Foreign Application Priority Data
Jun. 8, 2009    (JP) .................................. 2009-137329

(51) Int. Cl.
*H03M 1/00* (2006.01)
(52) U.S. Cl. .................... 341/110; 370/237; 375/295
(58) Field of Classification Search ........... 341/110–155
See application file for complete search history.

(56) References Cited

U.S. PATENT DOCUMENTS

| | | | | |
|---|---|---|---|---|
| 4,994,804 A | * | 2/1991 | Sakaguchi | 341/143 |
| 5,068,659 A | * | 11/1991 | Sakaguchi | 341/143 |
| 5,479,130 A | | 12/1995 | McCartney | |
| 7,466,257 B2 | * | 12/2008 | Akizuki et al. | 341/143 |

OTHER PUBLICATIONS

Norsworthy, et al.; Delta-Sigma Data Converters—Theory, Design, and Simulation; IEEE Press, 1996, pp. 204-206.

* cited by examiner

*Primary Examiner* — Lam T Mai
(74) *Attorney, Agent, or Firm* — Turocy & Watson, LLP

(57) ABSTRACT

An analog-to-digital converter includes a first switch circuit, a first integrator, a second switch circuit, a second integrator, a quantizer and a digital-to-analog converter. The first switch circuit receives an external analog signal, outputs the analog signal in reverse phase, and outputs the analog signal in positive phase. The first integrator receives and integrates the analog signal with cross-coupling. The second switch circuit outputs an output of the first integrator and a common mode output potential of the first integrator. The second integrator samples and integrates an output of the second switch circuit. The quantizer single-bit-quantizes an output of the second integrator to provide the output as a digital signal output. The digital-to-analog converter receives an output of the quantizer and provides the output as an analog signal output. Each of the first and second integrators receives and integrates an output of the digital-to-analog converter with cross-coupling.

18 Claims, 5 Drawing Sheets

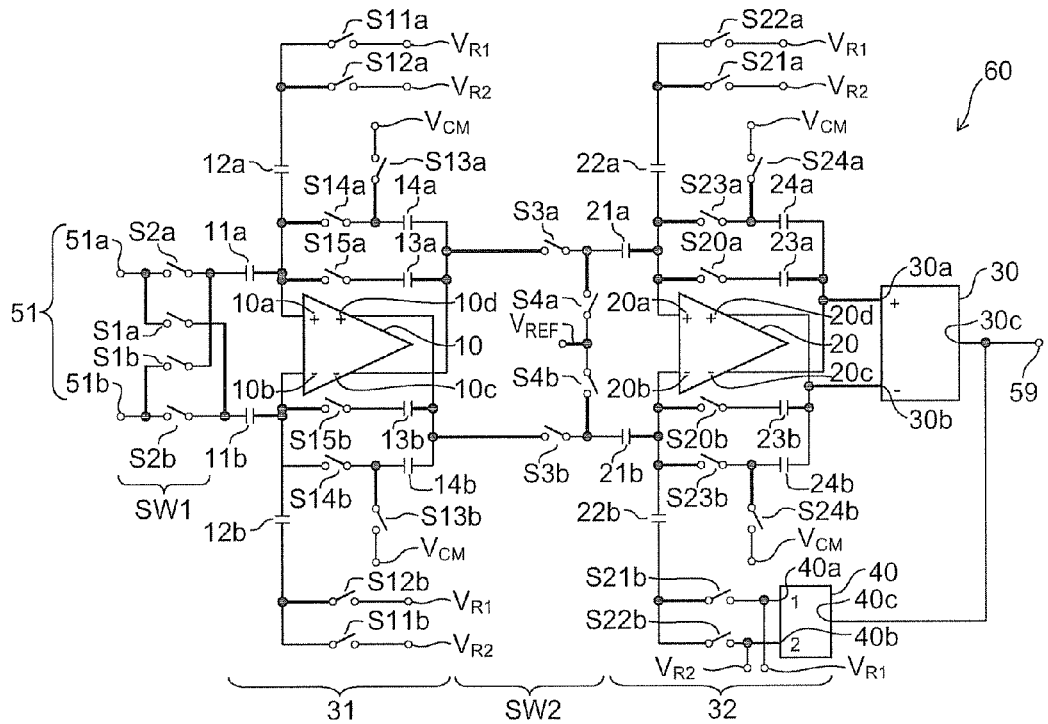
FIG. 1
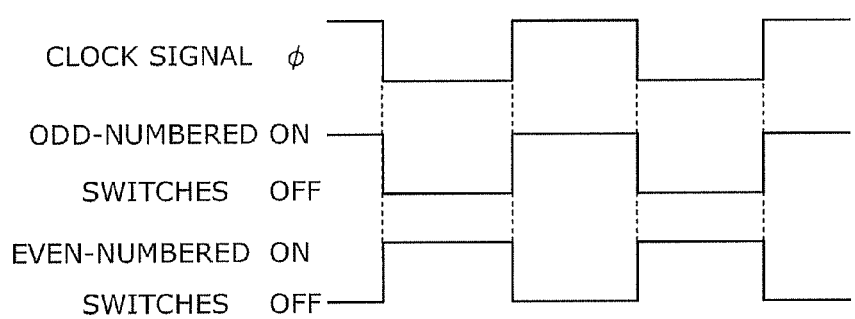
FIG. 2A  CLOCK SIGNAL ϕ
FIG. 2B  ODD-NUMBERED SWITCHES ON/OFF
FIG. 2C  EVEN-NUMBERED SWITCHES ON/OFF

US 8,207,879 B2

ANALOG-TO-DIGITAL CONVERTER, ANALOG-TO-DIGITAL CONVERSION METHOD, AND OPTICALLY COUPLED INSULATING DEVICE

CROSS-REFERENCE TO RELATED APPLICATIONS

This application is based upon and claims the benefit of priority from the prior Japanese Patent Application No. 2009-137329, filed on Jun. 8, 2009; the entire contents of which are incorporated herein by reference.

FIELD

Embodiments described herein relate generally to an analog-to-digital converter, an analog-to-digital conversion method, and an optically coupled insulating device.

BACKGROUND

Along with the digitization and increasing precision of electronic devices, digitization is progressing for the processing conventionally performed by analog circuits. For example, speed and precision increases are progressing for optically coupled insulating devices as well. Therefore, high speed and high precision is required also of analog-to-digital converters that digitize analog physical quantities; and various methods have been proposed.

Such methods include delta-sigma analog-to-digital converters using delta-sigma modulation, which are known as analog-to-digital converters having high precision and medium speed. Although it is possible to obtain a highly integrated delta-sigma analog-to-digital converter having low current consumption by using a switched-capacitor integrator, high precision requires a high sampling frequency.

Much research and development has been carried out regarding delta-sigma modulations. For example, there have been proposals to compensate errors due to the finite gain of an operational amplifier and compensate the errors due to the finite gain and offset voltage of an operational amplifier.

BRIEF DESCRIPTION OF THE DRAWINGS

FIG. 1 is a circuit diagram illustrating the configuration of an analog-to-digital converter according to an embodiment of the invention;

FIGS. 2A to 2C are timing charts of a clock signal and states of switches of the analog-to-digital converter;

DETAILED DESCRIPTION

Figure 3:
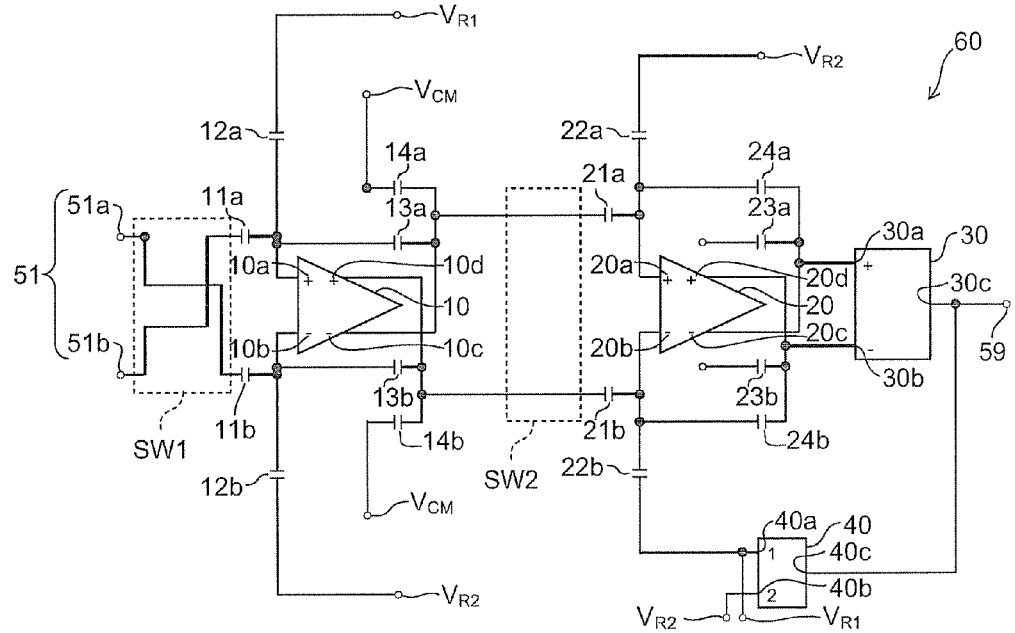
FIG. 3 is an equivalent circuit diagram when the clock signal of the analog-to-digital converter is H.

In general, according to one embodiment, an analog-to-digital converter includes a first switch circuit, a first integrator, a second switch circuit, a second integrator, a quantizer and a digital-to-analog converter. The first switch circuit receives an external analog signal, outputs the analog signal in reverse phase, and outputs the analog signal in positive phase. The first integrator receives and integrates the analog signal with cross-coupling. The second switch circuit outputs an output of the first integrator and a common mode output potential of the first integrator. The second integrator samples and integrates an output of the second switch circuit. The quantizer single-bit-quantizes an output of the second integrator to provide the output as a digital signal output. The digital-to-analog converter receives an output of the quantizer and provides the output as an analog signal output. Each of the first and second integrators receives and integrates an output of the digital-to-analog converter with cross-coupling.

Exemplary embodiments of the invention will now be described in detail with reference to the drawings.

In the specification and the drawings of the application, components similar to those described in regard to a drawing thereinabove are marked with like reference numerals, and a detailed description is omitted as appropriate.

In the specification of the application, a high level logical value of a digital signal is indicated by "H," and a low level logical value is indicated by "L."

Figure 4:
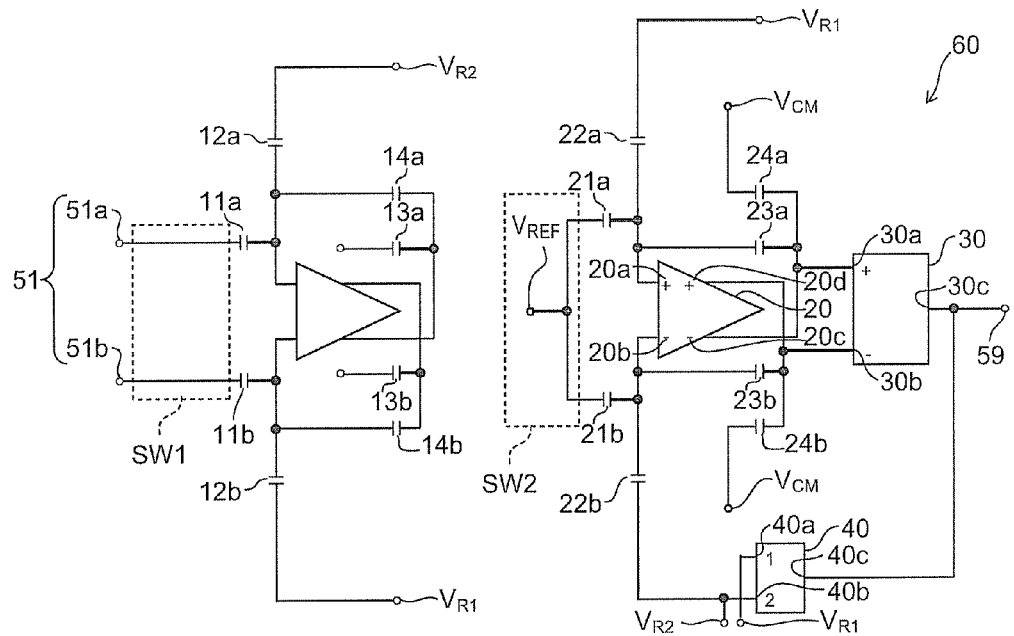
FIG. 4 is an equivalent circuit diagram when the clock signal of the analog-to-digital converter is L.

FIG. 1 is a circuit diagram illustrating the configuration of an analog-to-digital converter according to an embodiment of the invention. FIGS. 2A to 2C are timing charts of a clock signal and states of switches of the analog-to-digital converter. FIG. 2A illustrates the clock signal. FIG. 2B illustrates the state of odd-numbered switches. FIG. 2C illustrates the state of even-numbered switches. FIG. 3 is an equivalent circuit diagram when the clock signal of the analog-to-digital converter is H. FIG. 4 is an equivalent circuit diagram when the clock signal of the analog-to-digital converter is L.

Switches that are OFF are omitted from FIG. 3 and FIG. 4. Switches that are ON are illustrated as interconnects, and the reference numerals are omitted.

As illustrated in FIG. 1, FIG. 3, and FIG. 4, an analog-to-digital converter 60 of this example includes a first switch circuit SW1, a second switch circuit SW2, a first integrator 31, a second integrator 32, a quantizer 30, and a digital-to-analog converter 40.

An analog signal received by input terminals 51a and 51b is input to the first integrator 31 via the first switch circuit SW1. The output of the first integrator 31 is input to the second integrator 32 via the second switch circuit SW2. The output of the second integrator 32 is quantized by the quantizer 30 to be output as a digital signal to an output terminal 59.

The output of the quantizer 30 is input to the digital-to-analog converter 40. The output of the digital-to-analog converter 40 is input to each of the first and second integrators 31 and 32 as analog data to form a feedback loop.

As illustrated in FIG. 1, FIG. 3, and FIG. 4, the analog-to-digital converter 60 of this example is a second order delta-sigma analog-to-digital converter using the first and second integrators 31 and 32.

The first integrator 31 includes a first operational amplifier 10, a pair of first capacitors 11a and 11b, a pair of second capacitors 12a and 12b, a pair of third capacitors 13a and 13b, a pair of fourth capacitors 14a and 14b, switches S11a, S12a, S13a, S14a, S15a, S11b, S12b, S13b, S14b, and S15b.

Herein, as illustrated in FIGS. 2A to 2C, the switches operate synchronously with a clock signal φ having a sampling frequency fs. Herein, the odd switches S11a, S13a, S15a, S11b, S13b, and S15b are ON during a first interval in which the clock signal φ is H and OFF during a second interval in which the clock signal φ is L. Conversely, the even switches S12a, S14a, S12b and S14b are OFF during the first interval in which the clock signal φ is H and ON during the second interval in which the clock signal φ is L.

The first integrator 31 is a switched-capacitor integrator that integrates during the first interval and performs sampling during the second interval.

The first operational amplifier 10 is fully differential and differentially amplifies each of the potentials input to the pair of first input terminals 10a and 10b and outputs the result to a pair of first output terminals 10c and 10d.

Herein, the first input terminals 10a and 10b are a non-inverting input terminal and an inverting input terminal, respectively. The first output terminals 10c and 10d are an inverting output terminal and a non-inverting output terminal, respectively. A Common Mode Feed Back (CMFB) circuit controls a common mode output potential of the first operational amplifier 10 to be $V_{REF}$ and a common mode input potential to be $V_{CM}$.

To maximize the dynamic range of the output of the first operational amplifier 10, it is desirable that $V_{REF}=(Vc+Vs)/2$. Here, Vc and Vs are potentials of the high potential side and the low potential side, respectively, of the power source. For example, for use with a single power source between a power source $V_{CC}$ and a ground GND, it is desirable that $V_{REF}=V_{CC}/2$.

One terminal of the first capacitor 11a is connected to the first switch circuit SW1, and the other terminal is connected to the first input terminal 10a. As described below, the first switch circuit SW1 connects the one terminal of the first capacitor 11a to the input terminal 51b during the first interval and to the input terminal 51a during the second interval.

The second capacitor 12a is described below.

One terminal of the third capacitor 13a is connected to the first output terminal 10c, and the other terminal is connected to the first input terminal 10a via the switch S15a. The switch S15a connects the other terminal of the third capacitor 13a to the first input terminal 10a during the first interval and opens the other terminal of the third capacitor 13a during the second interval.

Similarly, one terminal of the first capacitor 11b is connected to the first switch circuit SW1, and the other terminal is connected to the first input terminal 10b. As described below, the first switch circuit SW1 connects the one terminal of the first capacitor 11b to the input terminal 51a during the first interval and to the input terminal 51b during the second interval.

The second capacitor 12b is described below.

One terminal of the third capacitor 13b is connected to the first output terminal 10d, and the other terminal is connected to the first input terminal 10b via the switch S15b. The switch S15b connects the other terminal of the third capacitor 13b to the first input terminal 10b during the first interval and opens the other terminal of the third capacitor 13b during the second interval.

Thus, the first operational amplifier 10 is included in the switched-capacitor first integrator 31 which integrates the analog signal input to the pair of input terminals 51a and 51b during the first interval and performs sampling during the second interval.

One terminal of the fourth capacitor 14a is connected to the first output terminal 10c. The other terminal of the fourth capacitor 14a is connected to a common mode input potential $V_{CM}$ via the switch S13a during the first interval and to the first input terminal 10a via the switch S14a during the second interval.

Similarly, one terminal of the fourth capacitor 14b is connected to the first output terminal 10d. The other terminal of the fourth capacitor 14b is connected to the common mode input potential $V_{CM}$ via the switch S13b during the first interval and to the first input terminal 10b via the switch S14b during the second interval.

The second integrator 32 includes a second operational amplifier 20, a pair of fifth capacitors 21a and 21b, a pair of sixth capacitors 22a and 22b, a pair of seventh capacitors 23a and 23b, a pair of eighth capacitors 24a and 24b, and switches S21a, S22a, S23a, S24a, S25a, S21b, S22b, S23b, S24b, and S25b.

As illustrated in FIGS. 2A to 2C, similarly to the first integrator 31 recited above, the switches operate synchronously with the clock signal φ having the sampling frequency fs. Herein, the odd switches are ON during the first interval in which the clock signal φ is H and OFF during the second interval in which the clock signal φ is L. Conversely, the even switches are OFF during the first interval in which the clock signal φ is H and ON during the second interval in which the clock signal φ is L.

The second integrator 32 is a switched-capacitor integrator that integrates during the second interval and performs sampling during the first interval.

The second operational amplifier 20 is fully differential and differentially amplifies each of the potentials input to the pair of second input terminals 20a and 20b and outputs the result to the pair of the second output terminals 20c and 20d.

Herein, the second input terminals 20a and 20b are a non-inverting input terminal and an inverting input terminal, respectively. The second output terminals 20c and 20d are an inverting output terminal and a non-inverting output terminal, respectively. Similarly to the first operational amplifier 10, a CMFB circuit controls the common mode output potential and the common mode input potential of the second operational amplifier 20 to be $V_{REF}$.

One terminal of the fifth capacitor 21a is connected to the second switch circuit SW2, and the other terminal is connected to the second input terminal 20a. As described below, the second switch circuit SW2 connects the one terminal of the fifth capacitor 21a to the output of the first integrator 31 during the first interval and to a common mode output potential $V_{REF}$ during the second interval.

The sixth capacitor 22a is described below.

One terminal of the seventh capacitor 23a is connected to the second output terminal 20c, and the other terminal is connected to the second input terminal 20a via a switch S20a. The switch S20a connects the other terminal of the seventh capacitor 23a to the second input terminal 20a during the second interval and opens the other terminal of the seventh capacitor 23a during the first interval.

Similarly, one terminal of the fifth capacitor 21b is connected to the second switch circuit SW2, and the other terminal is connected to the second input terminal 20b. As described below, the second switch circuit SW2 connects the one terminal of the fifth capacitor 21b to the output of the first integrator 31 during the first interval and to the common mode output potential $V_{REF}$ during the second interval.

The sixth capacitor 22b is described below.

One terminal of the seventh capacitor 23b is connected to the second output terminal 20d, and the other terminal is connected to the second input terminal 20b via a switch S20b. As described below, the switch S20b connects the other terminal of the seventh capacitor 23b to the second input terminal 20b during the second interval and opens the other terminal of the seventh capacitor 23b during the first interval.

Thus, the second operational amplifier 20 is included in the switched-capacitor second integrator 32 which integrates the analog signal input to the pair of fifth capacitors 21a and 21b during the second interval and performs sampling during the first interval.

One terminal of the eighth capacitor 24a is connected to the second output terminal 20c. The other terminal of the eighth capacitor 24a is connected to the common mode input potential $V_{CM}$ via the switch S23a during the second interval and to the second input terminal 20a via the switch S23a during the first interval.

Similarly, one terminal of the eighth capacitor 24b is connected to the second output terminal 20d. The other terminal of the eighth capacitor 24b is connected to the common mode input potential $V_{CM}$ via the switch S24b during the second interval and to the second input terminal 20b via the switch S23b during the first interval.

Thus, each of the first and second integrators 31 and 32 is a switched-capacitor integrator having a balanced configuration.

As described below, the offset voltages of the first and second integrators 31 and 32 are compensated by being balanced.

The first switch circuit SW1 includes the switches S1a, S1b, S2a, and S2b.

The first switch circuit SW1 connects the pair of input terminals 51a and 51b to the input of the first integrator 31, i.e., the one terminals of the pair of first capacitors 11a and 11b.

As illustrated in FIGS. 2A to 2C, the switches operate synchronously with the clock signal $\phi$ having the sampling frequency fs. Herein, the odd switches S1a and Sib are ON during the first interval in which the clock signal $\phi$ is H and OFF during the second interval in which the clock signal $\phi$ is L. Conversely, the even switches S2a and S2b are OFF during the first interval in which the clock signal $\phi$ is H and ON during the second interval in which the clock signal $\phi$ is L.

Accordingly, during the first interval, the first switch circuit SW1 connects the pair of input terminals 51a and 51b to the inputs of the first integrator, i.e., the pair of first capacitors 11a and 11b, in reverse phase as illustrated in FIG. 3. During the second interval, the first switch circuit SW1 connects the pair of input terminals 51a and 51b to the pair of first capacitors 11a and 11b in positive phase as illustrated in FIG. 4.

In FIG. 3 and FIG. 4, the first switch circuit SW1 is illustrated by a broken line; and a connection state formed of the switches S1a, S1b, S2a, and S2b is illustrated by solid lines.

In other words, during the first interval, the input terminal 51a is connected to the first capacitor 11b; and the input terminal 51b is connected to the first capacitor 11a. During the second interval, the input terminal 51a is connected to the first capacitor 11a; and the input terminal 51b is connected to the first capacitor 11b.

Accordingly, the first switch circuit SW1 receives an external analog signal, outputs the analog signal in reverse phase during the first interval, and outputs the analog signal in positive phase during the second interval.

The second switch circuit SW2 includes the switches S3a, S4a, S3b, and S4b.

Herein, the switches operate synchronously with the clock signal $\phi$ having the sampling frequency fs. The odd switches S3a and S3b are ON during the first interval in which the clock signal $\phi$ is H and OFF during the second interval in which the clock signal $\phi$ is L. Conversely, the even switches S4a and S4b are OFF during the first interval and ON during the second interval.

The second switch circuit SW2 controls the input of the second integrator 32. Namely, the second switch circuit SW2 connects the output of the first integrator 31 to the input of the second integrator 32 during the first interval and connects the input of the second integrator 32 to the common mode output potential $V_{REF}$ of the first integrator 31 during the second interval.

In this example, the second switch circuit SW2 includes the switches S3a, S3b, S4a, and S4b. During the first interval, the switches connect the first output terminal 10c, i.e., the output terminal of the first integrator 31, to the one terminal of the fifth capacitor 21a, i.e., the input terminal of the second integrator 32, and connect the first output terminal 10d to the one terminal of the fifth capacitor 21b. During the second interval, the switches connect the one terminals of the fifth capacitors 21a and 21b to the common mode output potential $V_{REF}$ of the first integrator 31.

In FIG. 3 and FIG. 4, the second switch circuit SW2 is illustrated by a broken line; and a connection state formed of the switches S3a, S3b, S4a, and S4b is illustrated by solid lines.

The quantizer 30 quantizes the output of the second integrator 32 and outputs the result as a digital signal $V_{DATA}$ to the output terminal 59. In other words, the terminals 30a and 30b of the quantizer 30 are connected to the pair of second output terminals 20c and 20d of the second operational amplifier 20, respectively. A terminal 30c of the quantizer 30 is connected to the output terminal 59.

In this example, the quantizer 30 quantizes the analog signal input to the terminals 30a and 30b into one bit and outputs the result to the terminal 30c. H is output to the terminal 30c when the high potential signal is input to the terminal 30a and the low potential signal is input to the terminal 30b. L is output to the terminal 30c when the low potential signal is input to the terminal 30a and the high potential signal is input to the terminal 30b.

The quantizer 30 includes, for example, a clocked comparator synchronous with the clock signal $\phi$ and the like.

The digital-to-analog converter 40 converts the digital signal $V_{DATA}$ into an analog signal and outputs the result to each of the first integrator 31 and the second integrator 32.

In other words, the digital-to-analog converter 40 is controlled by the digital signal $V_{DATA}$ input to the terminal 40c. The digital-to-analog converter 40 outputs a reference potential $V_{RP}$ to a terminal 40a and a reference potential $V_{RM}$ to a terminal 40b as an analog signal when the digital signal $V_{DATA}$ is H. The digital-to-analog converter 40 outputs the reference potential $V_{RM}$ to the terminal 40a and the reference potential $V_{RP}$ to the terminal 40b as an analog signal when the digital signal $V_{DATA}$ input to the terminal 40c is L.

Here, in this example, $V_{RP} > V_{RM} \geq 0$.

$V_{RP}$ and $V_{RM}$ are output to the terminals 40a and 40b, respectively, when the digital signal $V_{DATA}$ input to the terminal 40c is H. $V_{RM}$ and $V_{RP}$ are output to the terminals 40a and 40b, respectively, when the digital signal $V_{DATA}$ input to the terminal 40c is L.

The digital-to-analog converter 40 includes, for example, a reference voltage generator.

The terminals 40a and 40b of the digital-to-analog converter 40 are connected to the one terminal of the second capacitor 12a via the switches S11a and S12a, respectively. The other terminal of the second capacitor 12a is connected to the first input terminal 10a of the first operational amplifier 10.

The terminals 40a and 40b of the digital-to-analog converter 40 are connected to the one terminal of the second capacitor 12b via the switches S12b and sub, respectively. The other terminal of the second capacitor 12b is connected to the first input terminal 10b of the first operational amplifier 10.

In FIG. 1, the terminal 40a of the digital-to-analog converter 40 is connected to the switches S11a and S12b by an interconnect $V_{R1}$. Similarly, the terminal 40b is connected to the switches S12a and S11b by an interconnect $V_{R2}$.

As illustrated in FIGS. 2A to 2C, the switches operate synchronously with the clock signal φ having the sampling frequency fs. Herein, the odd switches S11a and S11b are ON during the first interval in which the clock signal φ is H and OFF during the second interval in which the clock signal φ is L. Conversely, the even switches 512a and S12b are OFF during the first interval in which the clock signal φ is H and ON during the second interval in which the clock signal φ is L.

In other words, the output of the digital-to-analog converter 40 is input to the first operational amplifier 10 via the pair of second capacitors 12a and 12b.

Similarly, the output of the digital-to-analog converter 40 is input to the one terminal of the sixth capacitor 22a via the switches S21a and S22a. The other terminal of the sixth capacitor 22a is connected to the second input terminal 20a of the second operational amplifier 20.

The output of the digital-to-analog converter 40 is input to the one terminal of the sixth capacitor 22b via the switches S21b and S22b. The other terminal of the sixth capacitor 22b is connected to the second input terminal 20b of the second operational amplifier 20.

In other words, the output of the digital-to-analog converter 40 is input to the second operational amplifier 20 via the pair of sixth capacitors 22a and 22b.

Figure 5:
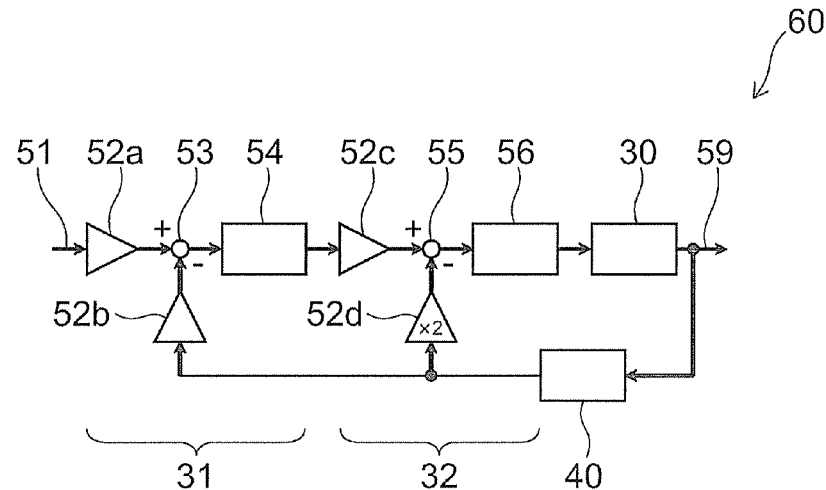
FIG. 5 is a block diagram illustrating the analog-to-digital converter illustrated in FIG. 1.

FIG. 5 is a block diagram illustrating the analog-to-digital converter 60 illustrated in FIG. 1.

Herein, an input terminal 51 illustrated in FIG. 5 represents the pair of input terminals 51a and 51b illustrated in FIG. 1. An analog signal $V_1$ input to the input terminal 51 is the difference between signals $V_{1a}$ and $V_{1b}$ input to the pair of input terminals 51a and 51b, respectively, such that $V_1=V_{1a}-V_{1b}$.

Gains 52a and 52b, a junction circuit 53, and an integrator 54 illustrated in FIG. 5 represent the first integrator 31 illustrated in FIG. 1. Similarly, gains 52c and 52d, a junction circuit 55, and an integrator 56 illustrated in FIG. 5 represent the second integrator 32 illustrated in FIG. 1.

The quantizer 30 and the digital-to-analog converter 40 illustrated in FIG. 5 are similar to those illustrated in FIG. 1. The first and second switch circuits SW1 and SW2 illustrated in FIG. 1 are omitted in FIG. 5.

As illustrated in FIG. 5, the input terminal 51 is multiplied by the gain 52a of the integrator 54 and input to the junction circuit 53. Also, the output of the digital-to-analog converter 40 is multiplied by the feedback gain 52b of the integrator 54 and input to the junction circuit 53.

When the digital signal $V_{DATA}$ is H, the junction circuit 53 subtracts the multiplication output of the feedback gain 52b of the integrator 54 from the multiplication output of the gain 52a of the integrator 54. When the digital signal $V_{DATA}$ is L, the multiplication output of the feedback gain 52b of the integrator 54 is added to the multiplication output of the gain 52a of the integrator 54.

The integrator 54 integrates the results of the addition or subtraction according to the state of the digital signal $V_{DATA}$.

In this example, the junction circuit 53 is functioned by the pair of first capacitors 11a and 11b and the pair of second capacitors 12a and 12b connected to the first input terminals 10a and 10b of the first operational amplifier 10, respectively. Accordingly, the integrator 54 and the junction circuit 53 correspond to the first integrator 31.

The output of the integrator 54 is multiplied by the gain 52c of the integrator 56 and input to the junction circuit 55. The output of the digital-to-analog converter 40 is multiplied by the feedback gain 52d of the integrator 56 and input to the junction circuit 55.

When the digital signal $V_{DATA}$ is H, the junction circuit 55 subtracts the multiplication output of the feedback gain 52d of the integrator 56 from the multiplication output of the gain 52c of the integrator 56. When the digital signal $V_{DATA}$ is L, the multiplication output of the feedback gain 52d of the integrator 56 is added to the multiplication output of the gain 52c of the integrator 56.

In this example, the junction circuit 55 is functioned by the pair of fifth capacitors 21a and 21b and the pair of sixth capacitors 22a and 22b connected to the second input terminals 20a and 20b of the second operational amplifier 20, respectively. Accordingly, the integrator 56 and the junction circuit 55 correspond to the second integrator 32.

The output of the integrator 56 is input to the quantizer 30. The output of the quantizer 30 is output to the output terminal 59 as the digital signal $V_{DATA}$.

The output of the quantizer 30 is input to the digital-to-analog converter 40. The output of the digital-to-analog converter 40 is provided as feedback to the integrators 54 and 56 as recited above.

As described below, in this example, both the gain 52a and the feedback gain 52b of the integrator 54 are set to 1. The gain 52c and the feedback gain 52d of the integrator 56 are set to 1 and 2, respectively.

Herein, linearization is achieved by taking both of the integrators 54 and 56 to be ideal integrators having a z transform of $1/(1-z^{-1})$ and taking the quantizer 30 to be a delay circuit $z^{-1}$ of a quantization noise E(z). A signal transfer function STF from the input signal $V_1$ to an output signal $V_3$ and a noise transfer function NTF from the quantization noise E to the output signal $V_3$ are shown in formulas (1-1) and (1-2), respectively.

$$STF=z^{-2} \tag{1-1}$$

$$NTF=(1-z^{-1})^2 \tag{1-2}$$

In other words, in the analog-to-digital converter 60 of this example, $STF=z^{-2}$ for the signal transfer function STF from the input signal $V_1$ to the output signal $V_3$; and the input signal $V_1$ becomes the output signal $V_3$ as-is. Also, $NTF=(1-z^{-1})^2$ for the noise transfer function NTF from the quantization noise E to the output signal $V_3$. The quantization noise E is reduced for low frequencies. For high frequencies, the quantization noise E is enhanced and output in the output signal $V_3$.

Here, $|NTF|^2=(\sin(\pi f/(2fs)))^4$ when it is taken that $z=\exp(j\pi f/fs)$ for the signal frequency f and the sampling frequency fs. A noise power density of $E^2|NTF|^2$ decreases by $f^4$ when the quantization noise E is white noise in the case where the signal frequency f is sufficiently smaller than the sampling frequency fs, i.e., $f<<fs/2$.

In the second order delta-sigma analog-to-digital converter using the two integrators 54 and 56 illustrated in FIG. 5, $|NTF|\alpha f^2$. Similarly, $|NTF|\alpha f^N$ in an Nth order delta-sigma analog-to-digital converter using N integrators.

Thus, delta-sigma modulation reduces the noise and increases a signal-to-noise ratio SNR for low frequencies by so-called noise shaping.

A maximum value of SNR of an Nth order delta-sigma analog-to-digital converter using a single-bit quantizer is shown in formula (1-3).

$$SNR = 3(2N+1) \times OSR^{(2N+1)}/(2\pi^{2N}) \qquad (1-3)$$

Here, OSR is an oversampling ratio, where $OSR = fs/(2f_{max})$ and $f_{max}$ is a maximum frequency of the input signal.

It can be seen from formula (1-3) that it is sufficient to increase the oversampling ratio OSR or increase the order N to realize a high resolution using the single-bit quantizer.

To obtain a high resolution in the case of a first order delta-sigma modulation, it is necessary to make the oversampling ratio OSR exceedingly large; and in many cases, the sampling frequency fs cannot be tolerated. Moreover, idle tones, in which periodic output signals occur for an input signal of a designated voltage, occur easily; dead bands, in which the output does not change for an input signal of a constant voltage or less, occur easily; and many problems exist during applications.

On the other hand, in the case of a delta-sigma modulation of a third or higher order, although the desired the signal-to-noise ratio SNR can be obtained without increasing the sampling frequency fs very much, there is a tendency to oscillate easily. Stability is not considered for the signal-to-noise ratio SNR of formula (1-3). In the case where stability is considered, the signal-to-noise ratio SNR is much smaller than the value obtained in formula (1-3). A multi-bit quantizer is often used to obtain stability, which is easily accompanied by an increase of the circuit scale and difficulties during circuit design.

For a second order delta-sigma modulation, it is often the case that problems during applications do not occur relating to stability, resolution, and the sampling frequency fs. For example, in the case where a voice signal having a maximum frequency $f_{max}$ of 20 kHz is converted with a 16-bit resolution ($16 \times 6.02 + 1.76 = 98$ dB), the oversampling ratio $OSR \geq 152$, and the necessary sampling frequency fs is not less than 6.1 MHz. Such a sampling frequency fs is sufficiently realizable without problems during main applications.

However, the signal-to-noise ratio SNR may worsen due to effects of the finite gain, band gain product, offset voltage, and noise of the operational amplifiers used in the switched-capacitor integrators. Moreover, the signal-to-noise ratio SNR may be smaller than the signal-to-noise ratio SNR obtained in formula (1-3) due to clock signal feed-through, charge injection in which a portion of the charge stored directly below the gates when the switches formed of MOS switches are OFF is injected into the capacitors, etc. Therefore, it is necessary to set the sampling frequency fs to a value greater than the sampling frequency fs obtained by calculation.

Therefore, in this example, the offset voltages of the first and second operational amplifiers 10 and 20 are compensated by the balanced configurations using the fully-differential first and second operational amplifiers 10 and 20 as described below.

Now returning again to FIG. 1 to FIG. 4, operations of the analog-to-digital converter 60 of this example will be described.

First, the first integrator 31 is considered.

As recited above, the first operational amplifier 10 is fully differential. A CMFB circuit controls the common mode output potential of the first operational amplifier 10 to be $V_{REF}$ and the common mode input potential to be $V_{CM}$.

The switches operate synchronously with the clock signal $\phi$ having the sampling frequency fs. Herein, the odd switches are ON during the first interval in which the clock signal $\phi$ is H and OFF during the second interval in which the clock signal $\phi$ is L. Conversely, the even switches are OFF during the first interval in which the clock signal $\phi$ is H and ON during the second interval in which the clock signal $\phi$ is L. The digital signal $V_{DATA}$ input to the terminal 40c is taken to be H.

First, the second interval, in which the clock signal $\phi$ is L, is considered. The second interval is a sampling interval of the first integrator 31.

Both of the electrostatic capacitances of the first capacitors 11a and 11b are taken to be $C_1$. Similarly, the electrostatic capacitances of the second capacitors 12a and 12b, the third capacitors 13a and 13b, and the fourth capacitors 14a and 14b are taken to be $C_2$, $C_3$, and $C_4$, respectively.

The input-referred offset voltage of the first operational amplifier 10 is taken to be $\delta v_1$.

The potentials of the nth sample of the analog signal input to each of the pair of input terminals 51a and 51b are $v_{1P} = v_{1P}(n)$ and $v_{1M} = v_{1M}(n)$, respectively. The analog signal is input to the first capacitors 11a and 11b in reverse phase. Hereinbelow, the sample values are represented by lower-case letters. The variable n is omitted except when particularly necessary.

Here, it is taken that the quantizer 30 outputs the digital signal $V_{DATA}$ of H to the output terminal 59 for the (n−1)th sample. In other words, the digital-to-analog converter 40 outputs $v_{RP}$ to the terminal 40a and $v_{RM}$ to the terminal 40b.

In the nth sample, charges of $q_{1a} = q_{1a}(n)$ and $q_{1b} = q_{1b}(n)$ given by formulas (2-1a) and (2-1b) are stored in the pair of first capacitors 11a and 11b, respectively. Similarly, charges $q_{2a}$, $q_{2b}$, $q_{3a}$, and $q_{3b}$ given by formulas (2-2a) to (2-3b) are stored in the second capacitors 12a and 12b and the third capacitors 13a and 13b, respectively. As recited above, the sample values of v(n) and q(n) of the voltage v and the charge q are represented by lower-case letters; and the variable n is omitted except when particularly necessary.

$$q_{1a} = C_1(v_{1P} - v_{CM} - \delta v_1/2) \qquad (2\text{-}1a)$$

$$q_{1b} = C_1(v_{1M} - v_{CM} + \delta v_1/2) \qquad (2\text{-}1b)$$

$$q_{2a} = C_2(v_{RM} - v_{CM} - \delta v_1/2) \qquad (2\text{-}2a)$$

$$q_{2b} = C_2(v_{RP} - v_{CM} + \delta v_1/2) \qquad (2\text{-}2b)$$

$$q_{3a} = C_3(v_{2P}(n-1/2) - v_{CM} - \delta v_1/2) \qquad (2\text{-}3a)$$

$$q_{3b} = C_3(v_{2M}(n-1/2) - v_{CM} + \delta v_1/2) \qquad (2\text{-}3b)$$

Here, $v_{CM}$ is the common mode input potential of the first operational amplifier 10. Also, $v_{2P}(n-1/2)$ and $v_{2M}(n-1/2)$ are the potentials of the first output terminals 10c and 10d, respectively, of the first operational amplifier 10 one-half clock period therebefore, that is, the final values of the first interval one-half period therebefore in which the clock signal φ is H.

Next, the first interval, in which the clock signal φ is H, is considered. The first interval is an integration interval of the first integrator 31.

In the nth sample, the charges $q_{1a}$, $q_{1b}$, $q_{2a}$, $q_{2b}$, $q_{3a}$, and $q_{3b}$ given by formulas (3-1a) to (3-3b) capacitors 11a and 11b, the second capacitors 12a and 12b, and the third capacitors 13a and 13b, respectively.

$$q_{1a}=C_1(v_{1M}-v_{CM}-\delta v_1/2) \quad (3\text{-}1a)$$

$$q_{1b}=C_1(v_{1P}-v_{CM}+\delta v_1/2) \quad (3\text{-}1b)$$

$$q_{2a}=C_2(v_{RP}-v_{CM}-\delta v_1/2) \quad (3\text{-}2a)$$

$$q_{2b}=C_2(v_{RM}-v_{CM}+\delta v_1/2) \quad (3\text{-}2b)$$

$$q_{3a}=C_3(\Delta v_{2P}(n)+v_{2P}(n-1/2)-v_{CM}-\delta v_1/2) \quad (3\text{-}3a)$$

$$q_{3b}=C_3(\Delta v_{2M}(n)+v_{2M}(n-1/2)-v_{CM}+\delta v_1/2) \quad (3\text{-}3b)$$

Here, $\Delta v_{2P}(n)$ and $\Delta v_{2M}(n)$ are output potential changes of the first integrator 31 that changed during the integration interval.

When the clock signal φ changes from L to H, that is, when the second interval changes to the first interval, the charges $q_{1a}$ and $q_{2a}$ stored in the first and second capacitors 11a and 12a move to the third capacitor 13a. By charge conservation, it follows that (2-1a)+(2-2a)+(2-3a)=(3-1a)+(3-2a)+(3-3a). Similarly, it follows that (2-1b)+(2-2b)+(2-3b)=(3-1b)+(3-2b)+(3-3b).

Accordingly, from formulas (2-1a) to (3-3b), the differences $\Delta v_{2P}$ and $\Delta v_{2M}$ of the potentials $v_{2P}$ and $v_{2M}$ of the first output terminals 10c and 10d for one clock period can be represented by formulas (4-1a) and (4-1b), respectively.

$$\Delta v_{2P}(n)=(C_1(v_{1P}-v_{1M})-C_2(v_{RP}-V_{RM}))/C_3 \quad (4\text{-}1a)$$

$$\Delta v_{2M}(n)=(C_1(v_{1M}-v_{1P})-C_2(v_{RM}-v_{RP}))/C_3 \quad (4\text{-}1b)$$

Because an output $v_2$ of the first integrator 31 is a differential voltage output, the output voltage change $\Delta v_2=\Delta v_{2P}(n)-\Delta v_{2M}(n)$ can be represented by formula (4-2) from formulas (4-1a) and (4-1b).

$$\Delta v_2=2(C_1(v_{1P}-v_{1M})-C_2(v_{RP}-v_{RM}))/C_3 \quad (4\text{-}2)$$

By performing a z transform on formula (4-2), the output $V_2$ of the first integrator 31 can be represented by formula (4-3).

$$V_2=(2/(1-z^{-1}))\times((C_1/C_3)V_1-(C_2/C_3)V_R)) \quad (4\text{-}3)$$

To derive formulas (4-1a) to (4-3) recited above, it is assumed that the potentials $v_{1P}$ and $v_{1M}$ of the analog signal input to the input terminals 51a and 51b, respectively, do not change between the first interval and the second interval. In the discussion described above, charge is transferred when the clock signal φ changes from L to H, and formulas (4-1a) to (4-3) hold. In other words, the analog signal is sampled at the instant when the clock signal φ changes from L to H, which corresponds to integrating the sampled analog signal.

To fix the input/output potentials of the first operational amplifier 10 by a CMFB circuit, it is necessary for all areas of the first operational amplifier 10 to be closed circuits. Although the pair of fourth capacitors 14a and 14b do not affect the output voltage, the pair of fourth capacitors 14a and 14b acts to make the first operational amplifier 10 a closed circuit during the second interval in which the clock signal φ is L and forms a circuit necessary for the CMFB circuit to operate normally.

Next, the second integrator 32 is considered.

First, the first interval, in which the clock signal φ is H, is considered. The first interval is a sampling interval of the second integrator 32.

Charges $q_{5a}$, $q_{5b}$, $q_{6a}$, $q_{6b}$, $q_{7a}$, and $q_{7b}$ given by formulas (5-1a), (5-1b), (5-2a), (5-2b), (5-3a), and (5-3b) are stored in the fifth capacitors 21a and 21b, the sixth capacitors 22a and 22b, and the seventh capacitors 23a and 23b, respectively. However, the electrostatic capacitances of the fifth capacitors 21a and 21b, the sixth capacitors 22a and 22b, and the seventh capacitors 23a and 23b are taken to be $C_6$, $C_6$, and $C_7$, respectively.

$$q_{5a}=C_5(v_{2P}-v_{CM}-\delta v_2/2) \quad (5\text{-}1a)$$

$$q_{5b}=C_5(v_{2M}-v_{CM}+\delta v_2/2) \quad (5\text{-}1b)$$

$$q_{6a}=C_6(v_{RM}-v_{CM}-\delta v_2/2) \quad (5\text{-}2a)$$

$$q_{6b}=C_6(v_{RP}-v_{CM}+\delta v_2/2) \quad (5\text{-}2b)$$

$$q_{7a}=C_7(v_{3P}(n-1/2)-v_{CM}-\delta v_2/2) \quad (5\text{-}3a)$$

$$q_{7b}=C_7(v_{3M}(n-1/2)-v_{CM}+\delta v_2/2) \quad (5\text{-}3b)$$

Here, $v_{3P}$ and $v_{3M}$ are the potentials of the second output terminals 20c and 20d of the second operational amplifier 20, i.e., the potentials of the inverting output terminal and the non-inverting output terminal, respectively. The argument n−1/2 represents the final potential value of the second interval one-half clock period therebefore. $\delta v_2$ is the input-referred offset voltage of the second operational amplifier 20.

Next, the second interval, in which the clock signal φ is L, is considered. The second integrator 32 is in an integration interval. The charges $q_{5a}$, $q_{5b}$, $q_{6a}$, $q_{6b}$, $q_{7a}$, and $q_{7b}$ given by formulas (6-1a), (6-1b), (6-2a), (6-2b), (6-3a), and (6-3b) are stored in the fifth capacitors 21a and 21b, the sixth capacitors 22a and 22b, and the seventh capacitors 23a and 23b, respectively.

$$q_{5a}=C_5(v_{REF}-v_{CM}-\delta v_2/2) \quad (6\text{-}1a)$$

$$q_{5b}=C_5(v_{REF}-v_{CM}+\delta v_2/2) \quad (6\text{-}1b)$$

$$q_{6a}=C_6(v_{RP}-v_{CM}-\delta v_2/2) \quad (6\text{-}2a)$$

$$q_{6b}=C_6(v_{RM}-v_{CM}+\delta v_2/2) \quad (6\text{-}2b)$$

$$q_{7a}=C_7(\Delta v_{3P}(n)+v_{3P}(n-1/2)-v_{CM}-\delta v_2/2) \quad (6\text{-}3a)$$

$$q_{7b}=C_7(\Delta v_{3M}(n)+v_{3M}(n-1/2)-v_{CM}+\delta v_2/2) \quad (6\text{-}3b)$$

Here, $\Delta v_{3P}(n)$ and $\Delta v_{3M}(n)$ are the output potential changes of the second integrator 32 that changed during the integration interval.

The charges $q_{5a}$ and $q_{6a}$ stored in the fifth and sixth capacitors 21a and 22a move into the seventh capacitor 23a when the clock signal φ changes from H to L, that is, when the first interval changes to the second interval. By charge conservation, it follows that (5-1a)+(5-2a)+(5-3a)=(6-1a)+(6-2a)+(6-3a). Similarly, it follows that (5-1b)+(5-2b)+(5-3b)=(6-1b)+(6-2b)+(6-3b).

Accordingly, from formulas (5-1a) to (6-3b), the output voltage changes $\Delta v_{3P}$ and $\Delta v_{3M}$ of one clock period of the potentials $v_{3P}$ and $v_{3M}$ of the second output terminals 20c and 20d can be represented by formulas (7-1a) and (7-1b).

$$\Delta v_{3P}(n)=(C_5(v_{2P}-v_{REF})-C_6(v_{RP}-v_{RM}))/C_7 \quad (7\text{-}1a)$$

$$\Delta v_{3M}(n)=(C_5(v_{2M}-v_{REF})-C_6(v_{RM}-v_{RP}))/C_7 \quad (7\text{-}1b)$$

Because the output $v_3$ of the second integrator 32 is the differential voltage output of $V_{3P}-v_{3M}$, the output voltage change $\Delta v_3 = \Delta v_{3P} - \Delta v_{3M}$ of one clock period can be represented by formula (7-2) from formulas (7-1a) and (7-1b).

$$\Delta v_3 = \Delta v_{3P} - \Delta v_{3M} \qquad (7-2)$$
$$= (C_5(v_{2P} - V_{2M}) - 2C_6(v_{RP} - v_{RM}))/C_7$$

By performing a z transform on formula (7-2), the output $V_3$ of the second integrator 32 can be represented by formula (7-3).

$$V_3 = (1/(1-z^{-1})) \times ((C_5/C_7)V_2 - (2C_6/C_7)V_R)) \qquad (7-3)$$

Although the pair of eighth capacitors 24a and 24b do not affect the output voltage, the pair of eighth capacitors 24a and 24b acts to make the second operational amplifier 20 a closed circuit during the first interval in which the clock signal φ is H and forms a circuit necessary for the CMFB circuit to operate normally. The pair of eighth capacitors 24a and 24b is similar to the pair of fourth capacitors 14a and 14b of the first integrator 31.

Next, the digital signal $V_{DATA}$ input to the terminal 40c is taken to be L. In such a case, $V_{RM}$ and $V_{RP}$ are output to the terminals 40a and 40b, respectively.

Accordingly, similarly to the discussion described above, the output voltage change $\Delta v_2$ of one clock period of the first integrator 31 can be represented by formula (8-1).

$$\Delta v_2 = 2(C_1(v_{1P}-v_{1M}) + C_2(v_{RP}-v_{RM}))/C_3 \qquad (8-1)$$

The output voltage change $\Delta v_3$ of one clock period of the second integrator 32 can be represented by formula (8-2).

$$\Delta v_3 = (C_5(v_{2P}-v_{2M}) + 2C_6(v_{RP}-v_{RM}))/C_7 \qquad (8-2)$$

In other words, operations are performed such that the feedback signal is subtracted at the junction circuit when the digital signal $V_{DATA}$ input to the terminal 40c is H and the feedback signal is added at the junction circuit when the digital signal $V_{DATA}$ is L.

Comparing formulas (4-3) and (7-3) with the block diagram of FIG. 5 gives the following correspondences for the analog-to-digital converter 60 of this example.

gain 52a of integrator 54=$2(C_1/C_3)$=1 feedback gain 52b of integrator 54=$2(C_2/C_3)$=1 gain 52c of integrator 56=$(C_5/C_7)$=1 feedback gain 52d of integrator 56=$2(C_6/C_7)$=2

In the analog-to-digital converter 60 of this example, the output $v_3$ is not affected by the offset voltages $\delta v_1$ and $\delta v_2$ of the first and second operational amplifiers 10 and 20, respectively. The first integrator 31 has a balanced configuration; and the input portions of the first capacitors 11a and 11b and the feedback portions of the second capacitors 12a and 12b have cross-coupled connections. The feedback portions of the sixth capacitors 22a and 22b of the second integrator 32 also have cross-coupled connections.

Accordingly, the electrostatic capacitances $C_1$, $C_2$, and $C_6$ of the first capacitors 11a and 11b, the second capacitors 12a and 12b, and the sixth capacitors 22a and 22b can be half of those of the case where cross-coupled connections are not used; and the circuit surface area can be reduced.

Also, because a cross-coupled connection is not used at the input portion of the integrator 56, even in the case where the capacitances have the same magnitude, i.e., $C_5=C_6=C_7$, the gain 52c can be 1 and the gain 52d can be 2; and the relative fluctuation of the capacitance can be held to a minimum.

However, by halving the electrostatic capacitance $C_1$ of the first capacitors 11a and 11b, the noise power resulting from the capacitance can be doubled. In other words, the noise of the input portion doubles.

However, in this example, the signal voltage also is doubled because the input portion of the first integrator 31 has cross-coupled connections. Therefore, the ratio of the noise power resulting from the signal power and capacitance of the input portions is improved by a factor of 2 (3 dB); the input potential can be sampled with high precision; and a high precision delta-sigma analog-to-digital converter can be realized.

The main noise source in the delta-sigma analog-to-digital converter is 1/f noise of the first operational amplifier 10. However, in this example, the inputs have cross-coupled connections. Therefore, in the case where the same electrostatic capacitances are used, the signal voltage is doubled. Accordingly, in the case where an operational amplifier is used having the same 1/f noise power as a conventional example, the ratio of the signal power to the 1/f noise power is improved by a factor of 4 (6 dB); and a high precision delta-sigma analog-to-digital converter can be realized.

As recited above, in this example, the analog-to-digital converter 60 operates synchronously with the clock signal cp. In other words, the odd switches are ON during the first interval in which the clock signal φ is H and OFF during the second interval in which the clock signal φ is L. Conversely, the even switches are OFF during the first interval in which the clock signal φ is H and ON during the second interval in which the clock signal φ is L.

However, to reliably move the charge stored in the capacitors, it is desirable to provide a constant interval in which all of the switches are OFF between the first interval and the second interval and between the second interval and the first interval. In other words, when the clock signal φ changes from L to H, the odd switches are controlled to switch ON after a constant interval has passed from the even switches being switched OFF. Similarly, when the clock signal φ is changed from H to L, the even switches are controlled to switch ON after a constant interval has passed from the odd switches being switched OFF.

Such a control is possible by using, for example, two-phase clock signals φ1 and φ2 that are synchronous with the clock signal φ and are not H simultaneously. For more reliable charge movement of the capacitors, a multi-phase clock signals may be used.

An analog-to-digital conversion method will now be described.

Based on the operations of the analog-to-digital converter 60, the following processes are executed repeatedly for each sampling interval to convert the input analog signal into a digital signal.

Namely, the analog signal input in positive phase and the feedback signal input in reverse phase are integrated during the first interval; and the analog signal input in reverse phase and the feedback signal input in positive phase are sampled during the second interval (the sampling process). This process is executed by the first integrator 31 of the analog-to-digital converter 60 recited above.

The output of the sampling process recited above and the feedback signal input in reverse phase are sampled during the first interval; and the feedback signal is integrated in positive phase during the second interval (the integrating process). This process is executed by the second integrator 32 of the analog-to-digital converter 60 recited above.

The output of the integrating process recited above is single-bit-quantized when starting the first interval (the single-bit-quantizing process). This process is executed by the quantizer 30 of the analog-to-digital converter 60.

Digital-to-analog conversion of the output of the single-bit-quantizing process is performed to provide the feedback signal recited above (the feedback signal providing process). This process is executed by the digital-to-analog converter 40 of the analog-to-digital converter 60.

The analog-to-digital conversion method which receives and integrates each of the analog signal and the feedback signal with cross-coupling by the processes recited above can convert an analog signal to a digital signal with high precision.

Further, it is desirable for each of the sampling process and the integrating process recited above to have fully-differential executions; for a closed circuit to be formed during the first and second intervals; and for a common mode feedback to be provided. Thereby, it is possible to convert with even higher precision.

However, the charge stored in the capacitors moves and the output potential changes when the clock signal φ changes in the first and second integrators 31 and 32 of the analog-to-digital converter 60 of this example.

For example, the output potential of the second integrator 32 changes as illustrated in formula (7-2) during the integration interval of the second interval. The change of the output potential is due to the integration performed on the input signal.

On the other hand, the output potential of the second integrator 32 changes also during the sampling interval of the first interval. In other words, the charge of the fifth and sixth capacitors 21a, 21b, 22a, and 22b moves into the seventh capacitors 23a and 23b during the integration interval of the second interval. Subsequently, during the first interval, charges move when the eighth capacitors 24a and 24b are connected to the second input terminals 20a and 20b to conserve the total charge amount of the second input terminals. Therefore, the charge of the eighth capacitors 24a and 24b changes; and the output potential of the second operational amplifier 20 changes.

In the case where the electrostatic capacitances of the eighth capacitors 24a and 24b are equal to the electrostatic capacitances of the seventh capacitors, the output potential has substantially the same change and magnitude as those of the output potential during the integration interval of the second interval with the opposite sign.

The effects of the finite gains of the operational amplifiers used in the integrators appear in the changes of such potentials.

Figure 6:
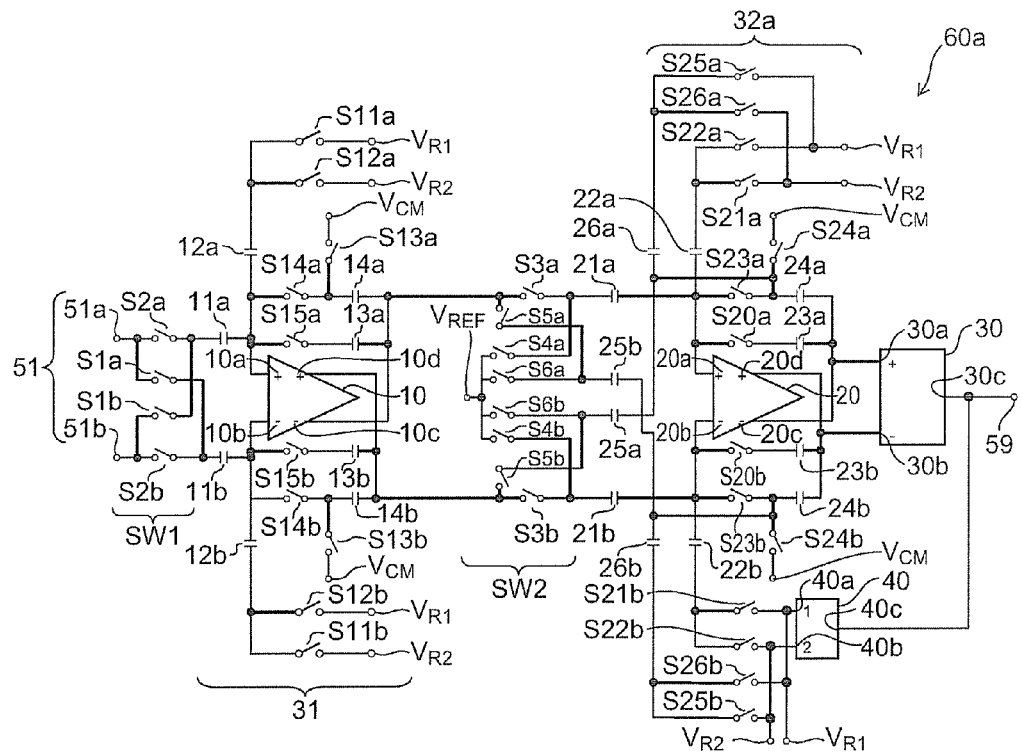
FIG. 6 is a circuit diagram illustrating another configuration of the analog-to-digital converter according to an embodiment of the invention.

FIG. 6 is a circuit diagram illustrating another configuration of the analog-to-digital converter according to an embodiment of the invention.

Figure 7:
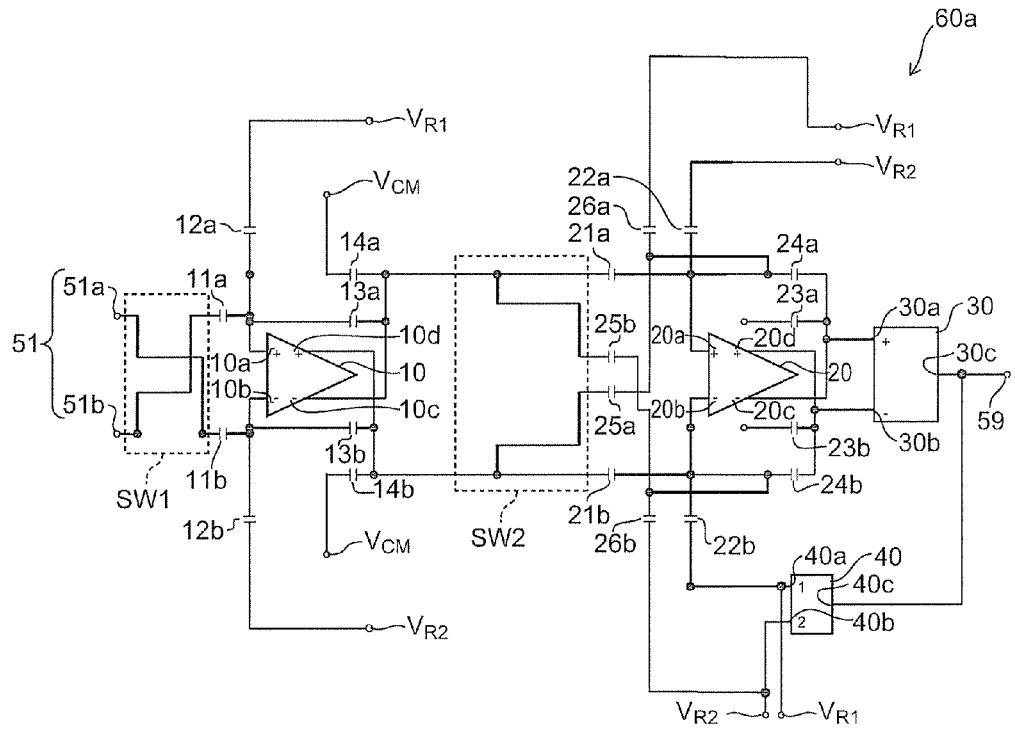
FIG. 7 is an equivalent circuit diagram when the clock signal of the analog-to-digital converter is H.

FIG. 7 is an equivalent circuit diagram when the clock signal of the analog-to-digital converter is H.

Figure 8:
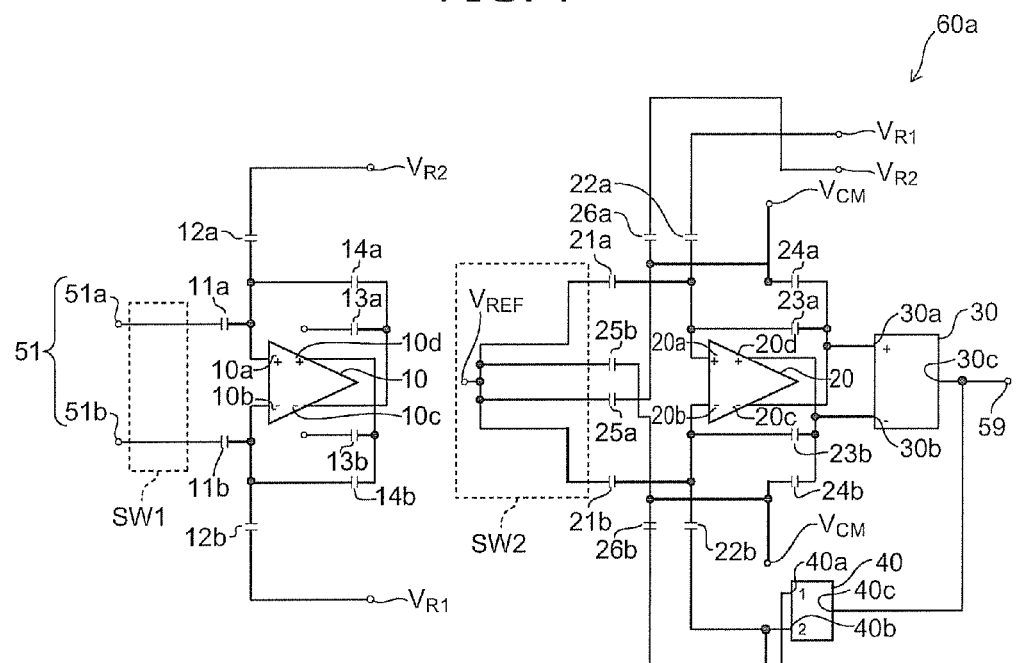
FIG. 8 is an equivalent circuit diagram when the clock signal of the analog-to-digital converter is L.

FIG. 8 is an equivalent circuit diagram when the clock signal of the analog-to-digital converter is L.

In addition to the configuration of the second integrator 32 of the analog-to-digital converter 60, the configuration of an analog-to-digital converter 60a of this example includes a pair of ninth capacitors 25a and 25b, a pair of tenth capacitors 26a and 26b, and switches S25a, S25b, S26a, S26b, S5a, S5b, S6a, and S6b as illustrated in FIGS. 6 to 8. Otherwise, the analog-to-digital converter 60a is similar to the analog-to-digital converter 60.

Here, an electrostatic capacitance $C_9$ of the ninth capacitors 25a and 25b is equal to the electrostatic capacitance $C_5$ of the fifth capacitors 21a and 21b. An electrostatic capacitance $C_{10}$ of the tenth capacitors 26a and 26b is equal to the electrostatic capacitance $C_6$ of the sixth capacitors 22a and 22b.

One terminal of the ninth capacitor 25a is connected to the other terminal of the eighth capacitor 24a. The other terminal of the ninth capacitor 25a is connected to the first output terminal 10d of the first operational amplifier 10 via the switch S5b and to the common mode output potential $V_{REF}$ of the first operational amplifier 10 via the switch S6b.

Similarly, one terminal of the ninth capacitor 25b is connected to the other terminal of the eighth capacitor 24b. The other terminal of the ninth capacitor 25b is connected to the first output terminal 10c of the first operational amplifier 10 via the switch S5a and to the common mode output potential $V_{REF}$ of the first operational amplifier 10 via the switch S6a.

Thus, the ninth capacitors 25a and 25b are connected to the output of the first integrator 31 during the first interval and to the common mode output potential $V_{REF}$ of the first integrator 31 during the second interval.

One terminal of the tenth capacitor 26a is connected to the other terminal of the eighth capacitor 24a. The other terminal of the tenth capacitor 26a is connected to the terminal 40a of the digital-to-analog converter 40 via the switch S25a and to the terminal 40b of the digital-to-analog converter 40 via the switch S26a.

Similarly, one terminal of the tenth capacitor 26b is connected to the other terminal of the eighth capacitor 24b. The other terminal of the tenth capacitor 26b is connected to the terminal 40b of the digital-to-analog converter 40 via the switch S25b and to the terminal 40a of the digital-to-analog converter 40 via the switch S26b.

Thus, the one terminals of the tenth capacitors 26a and 26b are connected to the other terminals of the eighth capacitors 24a and 24b, respectively, and the other terminals are connected in reverse phase to the terminals 40a and 40b of the digital-to-analog converter 40.

As illustrated in FIGS. 6 to 8, the charge stored in the ninth and tenth capacitors 25a, 25b, 26a, and 26b is not transmitted to the seventh capacitors 23a and 23b. Therefore, the transfer function of the second integrator 32 of this example is similar to that of the second integrator 32 illustrated in FIG. 1 and does not change.

In other words, formulas (5-1a) to (8-2) similarly hold for an integrator 32a of this example.

Potentials having the opposite polarity to the fifth capacitors 21a and 21b are input to the ninth capacitors 25a and 25b, respectively, during the first interval. During the second interval, both are connected to the same potential and the charge is discharged.

Potentials having the opposite polarity to the sixth capacitors 22a and 22b are input to the tenth capacitors 26a and 26b, respectively, during the first interval. During the second interval, the charge is discharged.

Therefore, the sum of the charge stored in the ninth capacitor 25a and the tenth capacitor 26a has substantially the same magnitude as the charge stored in the fifth capacitor 21a and the sixth capacitor 22a with the opposite sign. This is similar for the ninth capacitor 25b and the tenth capacitor 26b.

Accordingly, in the case where the switches S23a and S23b are ON in the first interval, the charge stored in the ninth capacitors 25a and 25b and the tenth capacitors 26a and 26b moves to the fifth capacitors 21a and 21b and the sixth capacitors 22a and 22b. The sum of the charge of the second input terminals 20a and 20b for these capacitors is zero. Therefore, the potential of the second input terminals 20a and 20b is maintained. The charge of the eighth capacitors 24a and 24b does not move; and the output potential of the second operational amplifier 20 is substantially the same value as the output potential of the second interval.

Thus, by adding the ninth capacitors 25a and 25b and the tenth capacitors 26a and 26b, the fluctuation of the potential of the input and output of the second operational amplifier 20 in the second integrator 32a is suppressed; and the effects of the finite gain are reduced.

Although capacitors may be added similarly to the first integrator 31, an equivalent input resistance Req decreases.

The equivalent input resistance Req of the first integrator 31 is given by formula (9-1).

$$Req=1/(2C_1 fs) \tag{9-1}$$

For example, in the case where the sampling frequency fs is 10 MHz and the electrostatic capacitance $C_1$ of the first capacitors 11a and 11b is 1 pF, the equivalent input resistance Req is 50 kΩ from formula (9-1). On the other hand, in the case where the ninth and tenth capacitors 25a, 25b, 26a, and 26b are connected also to the first integrator 31 similarly to the second integrator 32a of this example, the equivalent input resistance Req decreases.

For example, in the case where the electrostatic capacitances of the ninth and tenth capacitors 25a, 25b, 26a, and 26b are taken to be $C_9=C_1$ and $C_{10}=C_2$, respectively, the equivalent input resistance Req is half of that of formula (9-1), i.e., 25 kΩ.

It is often the case that the analog-to-digital converter 60a is a circuit for detecting an analog voltage; and it is undesirable for the input resistance to decrease. However, in the case of applications where a decrease of the input resistance is not problematic, the ninth and tenth capacitors 25a, 25b, 26a, and 26b may be connected as in the second integrator 32a of this example.

Figure 9:
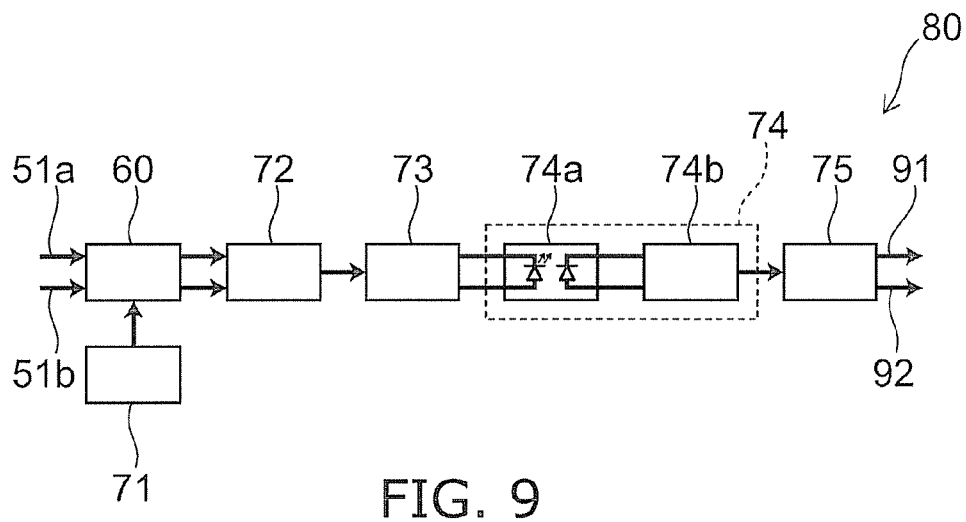
FIG. 9 is a circuit diagram illustrating the configuration of an optically coupled insulating device according to an embodiment of the invention.

FIG. 9 is a circuit diagram illustrating the configuration of an optically coupled insulating device according to an embodiment of the invention.

As illustrated in FIG. 9, an optically coupled insulating device 80 of this example includes the analog-to-digital converter 60, a controller 71, an encoder 72, an LED driver 73 (a driver), a photocoupler 74, and a decoder 75. In this example, the photocoupler 74 is used to insulate between the input and output.

An analog signal input to the input terminals 51a and 51b is converted into the digital signal $V_{DATA}$ by the analog-to-digital converter 60 and input to the encoder 72 with the clock signal φ having the sampling frequency fs. The encoder 72 modulates using the input of the digital signal $V_{DATA}$ and the clock signal φ to encode and output the result as a single-bit stream.

The output of the encoder 72 is input to the LED driver 73 (the driver) to drive the photocoupler 74. The output of the photocoupler 74 is input to the decoder 75, decoded into the digital signal $V_{DATA}$ and the clock signal φ, and output to the output terminals 91 and 92, respectively.

The controller 71 controls each portion of the optically coupled insulating device 80. In FIG. 9, only the output from the controller 71 to the analog-to-digital converter 60 is illustrated, and the other control lines are omitted.

Thus, the optically coupled insulating device 80 of this example is a device that outputs the analog signal $v_1$ input to the input terminals 51a and 51b as the single-bit digital signal $V_{DATA}$ and is insulated between the input and output by the photocoupler 74.

The analog-to-digital converter 60 is similar to the delta-sigma analog-to-digital converter recited above.

The encoder 72 encodes the digital signal $V_{DATA}$ and the clock signal φ into a single-bit stream because the photocoupler 74 of the latter stage transmits data on one signal line. The encoding may be performed by a modulation (conversion) of the data to impose the frequency component of the clock signal φ on the digital signal $V_{DATA}$, time multiplexing, frequency multiplexing, etc.

The photocoupler 74 includes a light emitting element and light receiving element 74a and a transimpedance amplifier 74b. The light emitting element and light receiving element 74a converts the input electrical signal to an optical signal, converts the optical signal into a current, and outputs the current. The transimpedance amplifier 74b converts the output current into a voltage.

The decoder 75 receives the output of the photocoupler 74 and decodes the digital signal $V_{DATA}$ and the clock signal φ.

For example, DLL and the like may be used to reproduce the clock signal φ and further decode the digital signal $V_{DATA}$ from the input data. PLL also may be used to reproduce the clock signal φ.

Although a configuration is illustrated in this example in which the photocoupler 74 is used, the invention is not limited thereto. It is sufficient for the input electrical signal to be converted to an optical signal and the optical signal to be converted back into an electrical signal and output, thereby insulating the electrical signal between the input and output. For example, a configuration such as that illustrated in FIG. 9 may be used in which the electrical signal is converted into an optical signal in the light receiving element and light emitting element 74a, the optical signal is transmitted by an optical fiber and the like, and then the optical signal is converted back into an electrical signal; and the electrical signal may be amplified and output by the transimpedance amplifier 74b.

Insulating circuits having high noise immunity such as insulating amplifiers are used in environments such as factories and hospitals where high power electrical devices coexist with highly sensitive electronic devices. Optically coupled insulating devices such as photocouplers that optically transmit signals have excellent noise immunity because complete electrical insulation is provided between the input and output.

However, photocouplers and the like have limitations on transmitting analog signals with high precision due to the elements such as LEDs converting the electrical signal into the optical signal, nonlinearity of the elements converting the optical signal back into an electrical signal, etc. Therefore, the analog signal is converted into a digital signal and then transmitted by a photocoupler.

The high precision optically coupled insulating device 80 can be provided by converting the analog signal into a digital signal using the analog-to-digital converter 60 of the example recited above and transmitting by a photocoupler.

Although a configuration is illustrated in this example in which the analog-to-digital converter 60 is used, the analog-to-digital converter 60a also may be used.

Although a configuration is illustrated in the optically coupled insulating device 80 of this example in which the delta-sigma modulated single-bit digital signal $V_{DATA}$ and the clock signal φ are output, multi-bit PCM data and the clock signal may be output.

Figure 10:
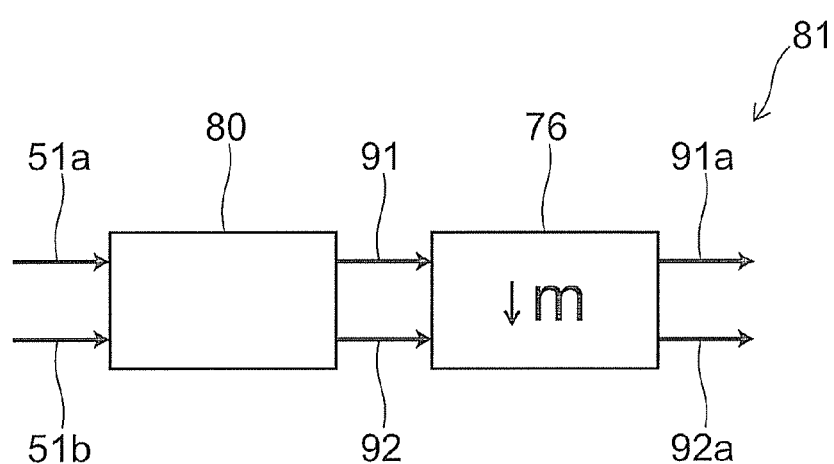
FIG. 10 is a circuit diagram illustrating another configuration of the optically coupled insulating device according to an embodiment of the invention.

FIG. 10 is a circuit diagram illustrating another configuration of the optically coupled insulating device according to an embodiment of the invention.

As illustrated in FIG. 10, an optically coupled insulating device 81 of this example differs from the optically coupled insulating device 80 by further including a decimation filter 76.

A single-bit digital signal of the optically coupled insulating device 80 is input to the decimation filter 76. The decimation filter 76 downsamples the input with a sampling frequency of 1/m to provide multi-bit PCM data. The multi-bit PCM data and the clock signal are output to output terminals 91a and 92a, respectively. Here, m may be an integer not less than 2. The value of m may be any positive rational number.

The PCM data output may be multi-bit data output in parallel. The PCM data output also may be serial output.

The digital signal output by the optically coupled insulating device 81 of this example is PCM data and therefore is suited to subsequent data processing.

Figure 11:
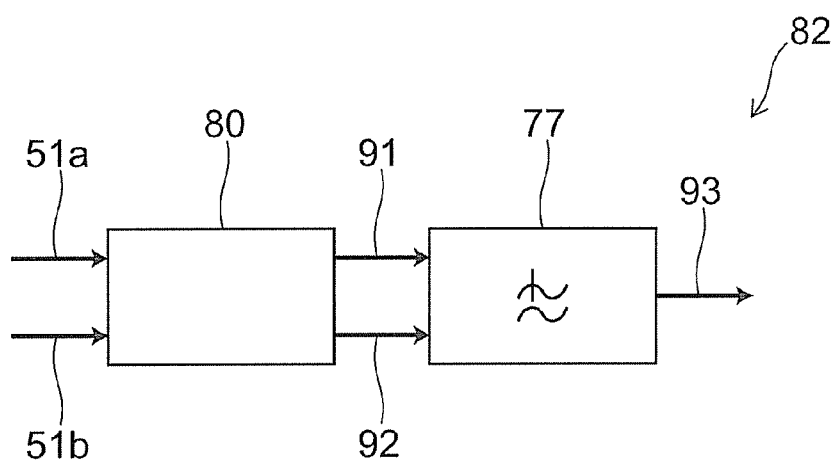
FIG. 11 is a circuit diagram illustrating another configuration of the optically coupled insulating device according to an embodiment of the invention.

FIG. 11 is a circuit diagram illustrating another configuration of the optically coupled insulating device according to an embodiment of the invention.

As illustrated in FIG. 11, an optically coupled insulating device 82 of this example differs from the optically coupled insulating device 80 by further including a low-pass filter 77.

The single-bit digital signal of the optically coupled insulating device 80 is input to the low-pass filter 77 and output to an output terminal 93 as an analog signal.

The input and output are analog signals, and the processing is easy.

The low-pass filter 77 may include, for example, an active filter. For example, a low-pass filter may be formed of a switched-capacitor filter similarly to the first and second integrators 31 and 32 of the analog-to-digital converter 60.

Hereinabove, exemplary embodiments of the invention are described with reference to specific examples. However, the invention is not limited to these specific examples. For example, one skilled in the art may appropriately select specific configurations of components of analog-to-digital converters and optically coupled insulating devices from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all analog-to-digital converters and optically coupled insulating devices practicable by an appropriate design modification by one skilled in the art based on the analog-to-digital converters and the optically coupled insulating devices described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

While certain embodiments have been described, these embodiments have been presented by way of example only, and are not intended to limit the scope of the inventions. Indeed, the novel converters, methods and devices described herein may be embodied in a variety of other forms; furthermore, various omissions, substitutions and changes in the form of the converters, methods and devices described herein may be made without departing from the spirit of the inventions. The accompanying claims and their equivalents are intended to cover such forms or modification as would fall within the scope and spirit of the inventions.

The invention claimed is:

1. An analog-to-digital converter, comprising:
a first switch circuit that receives an external analog signal from outside, outputs the analog signal in reverse phase during a first interval, and outputs the analog signal in positive phase during a second interval;
a first integrator that receives and integrates the analog signal with cross-coupling by integrating an output of the first switch circuit during the first interval and sampling the output of the first switch circuit during the second interval;
a second switch circuit that outputs an output of the first integrator during the first interval and outputs a common mode output potential of the first integrator during the second interval;
a second integrator that samples an output of the second switch circuit during the first interval and integrates the output of the second switch circuit during the second interval;
a quantizer that single-bit-quantizes an output of the second integrator to provide the output of the second integrator as a digital signal output; and
a digital-to-analog converter that receives an output of the quantizer and provides the output of the quantizer as an analog signal output,
each of the first and second integrators receiving and integrating an output of the digital-to-analog converter with cross-coupling,
the first integrator including:
a fully-differential first operational amplifier that differentially amplifies each signal input to a pair of first input terminals and outputs to a pair of first output terminals;
a pair of first capacitors, one terminal of the first capacitor being connected to an output of the first switch circuit, the other terminal of the first capacitor being connected to the first input terminal;
a pair of second capacitors, one terminal of the second capacitor being connected in reverse phase to an output of the digital-to-analog converter, the other terminal of the second capacitor being connected to the first input terminal;
a pair of third capacitors, one terminal of the third capacitor being connected to the first output terminal, the other terminal of the third capacitor being connected to the first input terminal during the first interval and open during the second interval; and
a pair of fourth capacitors, one terminal of the fourth capacitor being connected to the first output terminal, the other terminal of the fourth capacitor being connected to a common mode input potential of the first operational amplifier during the first interval and connected to the first input terminal during the second interval, and
the second integrator includes:
a fully-differential second operational amplifier that differentially amplifies each signal input to a pair of second input terminals and outputs to a pair of second output terminals;
a pair of fifth capacitors, one terminal of the fifth capacitor being connected to an output of the second switch circuit, the other terminal of the fifth capacitor being connected to the second input terminal;
a pair of sixth capacitors, one terminal of the sixth capacitor being connected in positive phase to an output of the digital-to-analog converter, the other terminal of the sixth capacitor being connected to the second input terminal;
a pair of seventh capacitors, one terminal of the seventh capacitor being connected to the second output terminal, the other terminal of the seventh capacitor being connected to the second input terminal during the second interval and open during the first interval; and
a pair of eighth capacitors, one terminal of the eighth capacitor being connected to the second output terminal, the other terminal of the eighth capacitor being connected to a common mode input potential of the second operational amplifier during the second interval and connected to the second input terminal during the first interval, each of the first and second integrators being a switched-capacitor fully-differential integrator, and a closed circuit being formed and a common mode feedback being provided during the first and second intervals.

2. The converter according to claim 1, wherein the second integrator further includes:

a pair of ninth capacitors, one terminal of the ninth capacitor being connected to the other terminal of the eighth capacitor, the other terminal of the ninth capacitor being connected to an output of the first integrator during the first interval and connected to a common mode output potential of the first integrator during the second interval; and a tenth capacitor, one terminal of the tenth capacitor being connected to the other terminal of the eighth capacitor, the other terminal of the tenth capacitor being connected in reverse phase to an output of the digital-to-analog converter, an effect of a finite gain of the second operational amplifier being reduced by charging the ninth capacitor in opposite polarity to the fifth capacitor during the first interval, charging the tenth capacitor in opposite polarity to the sixth capacitor during the first interval, and discharging the ninth and tenth capacitors during the second interval.

3. The converter according to claim 1, wherein each of electrostatic capacitances of the first and second capacitors is set equal to one-half of an electrostatic capacitance of the third capacitor, and each of electrostatic capacitances of the fifth and sixth capacitors is set equal to an electrostatic capacitance of the seventh capacitor.

4. The converter according to claim 2, wherein each of electrostatic capacitances of the first and second capacitors is set equal to one-half of an electrostatic capacitance of the third capacitor, each of electrostatic capacitances of the fifth and sixth capacitors is set equal to an electrostatic capacitance of the seventh capacitor, and an electrostatic capacitance of the ninth capacitor is set equal to an electrostatic capacitance of the fifth capacitor and an electrostatic capacitance of the tenth capacitor is set equal to an electrostatic capacitance of the sixth capacitor.

5. An optically coupled insulating method, comprising:

integrating, during a first interval, an analog signal input in positive phase and a feedback signal input in reverse phase and sampling, during a second interval, the analog signal input in reverse phase and the feedback signal input in positive phase;

sampling, during the first interval, the feedback signal input in reverse phase and an output of the sampling of the analog and feedback signals and integrating, during the second interval, the feedback signal in positive phase;

single-bit-quantizing an output of the integrating of the feedback signal when starting the first interval, performing a digital to analog conversion of an output of the single-bit-quantizing to provide the feedback signal, each of the analog signal and the feedback signal being input and integrated with cross-coupling, encoding the output of the single-bit-quantizing and a clock signal into one bit, driving a photocoupler by an encoded signal, and decoding an output of the photocoupler.

6. The method according to claim 5, wherein each of the sampling and integrating is fully differential, and a closed circuit is formed and a common mode feedback is provided during the first and second intervals.

7. An optically coupled insulating device, comprising:

an analog-to-digital converter including a first switch circuit that receives an external analog signal, outputs the analog signal in reverse phase during a first interval, and outputs the analog signal in positive phase during a second interval, a first integrator that receives and integrates the analog signal with cross-coupling by integrating an output of the first switch circuit during a first interval and sampling the output of the first switch circuit during a second interval, a second switch circuit that outputs an output of the first integrator during the first interval and outputs a common mode output potential of the first integrator during the second interval, a second integrator that samples an output of the second switch circuit during the first interval and integrates the output of the second switch circuit during the second interval, a quantizer that single-bit-quantizes an output of the second integrator to provide the output of the second integrator as a digital signal output, and a digital-to-analog converter that receives an output of the quantizer and provides the output of the quantizer as an analog signal output, each of the first and second integrators receiving and integrating an output of the digital-to-analog converter with cross-coupling;

a controller that controls the first and second intervals;

an encoder that encodes and outputs an output of the analog-to-digital converter and an output of the controller as one bit;

a driver that receives an output of the encoder and outputs a drive signal;

a photocoupler that converts the drive signal into an optical signal, converts the optical signal back into an electrical signal, and outputs the electrical signal; and a decoder that decodes an output of the photocoupler.

8. The device according to claim 7, wherein each of the first and second integrators is a switched-capacitor fully-differential integrator, and a closed circuit is formed and a common mode feedback is provided during the first and second intervals.

9. The device according to claim 8, wherein the first integrator includes:

a fully-differential first operational amplifier that differentially amplifies each signal input to a pair of first input terminals and outputs to a pair of first output terminals;

a pair of first capacitors, one terminal of the first capacitor being connected to an output of the first switch circuit, the other terminal of the first capacitor being connected to the first input terminal;

a pair of second capacitors, one terminal of the second capacitor being connected in reverse phase to an output of the digital-to-analog converter, the other terminal of the second capacitor being connected to the first input terminal;

a pair of third capacitors, one terminal of the third capacitor being connected to the first output terminal, the other terminal of the third capacitor being connected to the first input terminal during the first interval and open during the second interval; and a pair of fourth capacitors, one terminal of the fourth capacitor being connected to the first output terminal, the other terminal of the fourth capacitor being connected to a common mode input potential of the first operational amplifier during the first interval and connected to the first input terminal during the second interval, and the second integrator includes: a fully-differential second operational amplifier that differentially amplifies each signal input to a pair of second input terminals and outputs to a pair of second output terminals;

a pair of fifth capacitors, one terminal of the fifth capacitor being connected to an output of the second switch circuit, the other terminal of the fifth capacitor being connected to the second input terminal;

a pair of sixth capacitors, one terminal of the sixth capacitor being connected in positive phase to an output of the digital-to-analog converter, the other terminal of the sixth capacitor being connected to the second input terminal;

a pair of seventh capacitors, one terminal of the seventh capacitor being connected to the second output terminal, the other terminal of the seventh capacitor being connected to the second input terminal during the second interval and open during the first interval; and a pair of eighth capacitors, one terminal of the eighth capacitor being connected to the second output terminal, the other terminal of the eighth capacitor being connected to a common mode input potential of the second operational amplifier during the second interval and connected to the second input terminal during the first interval.

10. The device according to claim 9, wherein the second integrator further includes: a pair of ninth capacitors, one terminal of the ninth capacitor being connected to the other terminal of the eighth capacitor, the other terminal of the ninth capacitor being connected to an output of the first integrator during the first interval and connected to a common mode output potential of the first integrator during the second interval; and a tenth capacitor, one terminal of the tenth capacitor being connected to the other terminal of the eighth capacitor, the other terminal of the tenth capacitor being connected in reverse phase to an output of the digital-to-analog converter, an effect of a finite gain of the second operational amplifier being reduced by charging the ninth capacitor in opposite polarity to the fifth capacitor during the first interval, charging the tenth capacitor in opposite polarity to the sixth capacitor during the first interval, and discharging the ninth and tenth capacitors during the second interval.

11. The device according to claim 9, wherein each of electrostatic capacitances of the first and second capacitors is set equal to one-half of an electrostatic capacitance of the third capacitor, and each of electrostatic capacitances of the fifth and sixth capacitors is set equal to an electrostatic capacitance of the seventh capacitor.

12. The device according to claim 10, wherein each of electrostatic capacitances of the first and second capacitors is set equal to one-half of an electrostatic capacitance of the third capacitor, each of electrostatic capacitances of the fifth and sixth capacitors is set equal to an electrostatic capacitance of the seventh capacitor, and an electrostatic capacitance of the ninth capacitor is set equal to an electrostatic capacitance of the fifth capacitor and an electrostatic capacitance of the tenth capacitor is set equal to an electrostatic capacitance of the sixth capacitor.

13. The device according to claim 7, further comprising a low-pass filter that receives an output of the decoder and outputs an analog signal.

14. The device according to claim 13, wherein each of the first and second integrators is a switched-capacitor fully-differential integrator, and a closed circuit is formed and a common mode feedback is provided during the first and second intervals.

15. The device according to claim 14, wherein the first integrator includes:

a fully-differential first operational amplifier that differentially amplifies each signal input to a pair of first input terminals and outputs to a pair of first output terminals;

a pair of first capacitors, one terminal of the first capacitor being connected to an output of the first switch circuit, the other terminal of the first capacitor being connected to the first input terminal;

a pair of second capacitors, one terminal of the second capacitor being connected in reverse phase to an output of the digital-to-analog converter, the other terminal of the second capacitor being connected to the first input terminal;

a pair of third capacitors, one terminal of the third capacitor being connected to the first output terminal, the other terminal of the third capacitor being connected to the first input terminal during the first interval and open during the second interval; and a pair of fourth capacitors, one terminal of the fourth capacitor being connected to the first output terminal, the other terminal of the fourth capacitor being connected to a common mode input potential of the first operational amplifier during the first interval and connected to the first input terminal during the second interval, and the second integrator includes: a fully-differential second operational amplifier that differentially amplifies each signal input to a pair of second input terminals and outputs to a pair of second output terminals;

a pair of fifth capacitors, one terminal of the fifth capacitor being connected to an output of the second switch circuit, the other terminal of the fifth capacitor being connected to the second input terminal;

a pair of sixth capacitors, one terminal of the sixth capacitor being connected in positive phase to an output of the digital-to-analog converter, the other terminal of the sixth capacitor being connected to the second input terminal;

a pair of seventh capacitors, one terminal of the seventh capacitor being connected to the second output terminal, the other terminal of the seventh capacitor being connected to the second input terminal during the second interval and open during the first interval; and a pair of eighth capacitors, one terminal of the eighth capacitor being connected to the second output terminal, the other terminal of the eighth capacitor being connected to a common mode input potential of the second operational amplifier during the second interval and connected to the second input terminal during the first interval.

16. The device according to claim 15, wherein the second integrator further includes:

a pair of ninth capacitors, one terminal of the ninth capacitor being connected to the other terminal of the eighth capacitor, the other terminal of the ninth capacitor being connected to an output of the first integrator during the first interval and connected to a common mode output potential of the first integrator during the second interval; and a tenth capacitor, one terminal of the tenth capacitor being connected to the other terminal of the eighth capacitor, the other terminal of the tenth capacitor being connected in reverse phase to an output of the digital-to-analog converter, an effect of a finite gain of the second operational amplifier being reduced by charging the ninth capacitor in opposite polarity to the fifth capacitor during the first interval, charging the tenth capacitor in opposite polarity to the sixth capacitor during the first interval, and discharging the ninth and tenth capacitors during the second interval.

17. The device according to claim 15, wherein each of electrostatic capacitances of the first and second capacitors is set equal to one-half of an electrostatic capacitance of the third capacitor, and each of electrostatic capacitances of the fifth and sixth capacitors is set equal to an electrostatic capacitance of the seventh capacitor.

18. The device according to claim 17, wherein each of electrostatic capacitances of the first and second capacitors is set equal to one-half of an electrostatic capacitance of the third capacitor, each of electrostatic capacitances of the fifth and sixth capacitors is set equal to an electrostatic capacitance of the seventh capacitor, and an electrostatic capacitance of the ninth capacitor is set equal to an electrostatic capacitance of the fifth capacitor and an electrostatic capacitance of the tenth capacitor is set equal to an electrostatic capacitance of the sixth capacitor.

* * * * *